United States Patent
Wong

(10) Patent No.: US 8,842,664 B2
(45) Date of Patent: Sep. 23, 2014

(54) CHASSIS MANAGEMENT MODULES FOR ADVANCED TELECOM COMPUTING ARCHITECTURE SHELVES, AND METHODS FOR USING THE SAME

(75) Inventor: Alton Wong, San Jose, CA (US)

(73) Assignee: ZNYX Networks, Inc., Fremont, CA (US)

( * ) Notice: Subject to any disclaimer, the term of this patent is extended or adjusted under 35 U.S.C. 154(b) by 324 days.

(21) Appl. No.: 13/246,749

(22) Filed: Sep. 27, 2011

(65) Prior Publication Data

US 2012/0076003 A1  Mar. 29, 2012

(51) Int. Cl.
H04L 12/26 (2006.01)
H04L 12/56 (2006.01)
G01R 31/08 (2006.01)
H05K 5/00 (2006.01)
H05K 3/00 (2006.01)
H05K 7/02 (2006.01)
H05K 7/14 (2006.01)

(52) U.S. Cl.
CPC .................................... H05K 7/1459 (2013.01)
USPC ........... 370/387; 370/388; 370/216; 370/219; 370/242; 370/401; 361/787; 361/788; 361/725; 361/748; 709/221

(58) Field of Classification Search
None
See application file for complete search history.

(56) References Cited

U.S. PATENT DOCUMENTS

| | | | |
|---|---|---|---|
| 5,625,780 A * | 4/1997 | Hsieh et al. | 710/316 |
| 6,741,552 B1 * | 5/2004 | McCrosky et al. | 370/218 |
| 6,935,868 B1 * | 8/2005 | Campini et al. | 439/67 |
| 7,229,294 B1 | 6/2007 | Patel et al. | |
| 7,293,090 B1 | 11/2007 | Saleh et al. | |
| 8,345,687 B2 * | 1/2013 | Chida | 370/392 |
| 8,369,321 B2 * | 2/2013 | Aybay | 370/388 |
| 8,498,309 B2 * | 7/2013 | Campini et al. | 370/466 |
| 2005/0275504 A1 * | 12/2005 | Torza | 340/2.22 |
| 2006/0031488 A1 | 2/2006 | Swales | |
| 2006/0109782 A1 * | 5/2006 | Ra et al. | 370/216 |
| 2006/0232134 A1 * | 10/2006 | Kirkorian | 307/38 |
| 2007/0058632 A1 * | 3/2007 | Back et al. | 370/392 |
| 2007/0104091 A1 * | 5/2007 | Lee et al. | 370/216 |
| 2007/0230148 A1 * | 10/2007 | Campini et al. | 361/788 |
| 2007/0255430 A1 * | 11/2007 | Sharma et al. | 700/20 |
| 2009/0024724 A1 | 1/2009 | Hirai | |
| 2009/0251867 A1 | 10/2009 | Sharma et al. | |
| 2010/0137001 A1 | 6/2010 | Cho et al. | |

* cited by examiner

*Primary Examiner* — Candal Elpenord
(74) *Attorney, Agent, or Firm* — Carr & Ferrell LLP

(57) ABSTRACT

A printed circuit board (PCB) for an Advanced Telecommunications Computing Architecture (ATCA) shelf. The ATCA shelf may include a backplane providing a payload power supply and a standby power supply. Additionally, the PCB may include a first shelf management controller (ShMC) and a multiport switch, the multiport switch electrically coupling the first ShMC with a second ShMC on a second PCB by way of the backplane, the first ShMC utilizing standby power provided by the backplane at least when payload power is not available.

6 Claims, 3 Drawing Sheets

CHASSIS MANAGEMENT MODULES FOR ADVANCED TELECOM COMPUTING ARCHITECTURE SHELVES, AND METHODS FOR USING THE SAME

BACKGROUND OF THE TECHNOLOGY

1. Field of the Invention

The present technology relates to devices that utilize the Advanced Telecommunications Computing Architecture (ATCA) specifications, and more particularly, to redundant chassis management modules that are cross-coupled to one another via dedicated multiport switches integrated into each of the chassis management modules. In other embodiments, the present technology may include ATCA shelves that include these redundant chassis management modules. According to some embodiments, the present technology may include methods for increasing the payload capacity and reducing the power consumption of an ATCA shelf by utilizing these redundant chassis management modules.

2. Description of the Related Art

Broadly described, a 5U ATCA shelf is a modular computing device that includes a rack mountable enclosure that typically has six ATCA compliant slots that are interconnected electrically via a backplane. 5U ATCA shelves are constructed in accordance with the AdvancedTCA standards. It will be understood that each of the slots may be adapted to receive a payload blade. It will be further understood that the payload blades may provide any of a number of computing functionalities or combinations of computing functionalities. A payload blade (as well as the chassis management modules and hubs) may also be referred to as a field replaceable unit (FRU) and/or a node.

Generally speaking, the backplane of the shelf may provide power and electrical coupling between the different payload blades of the shelf and two chassis management modules. These two chassis management modules are configured to monitor and control the operation of the individual payload blades.

A typical chassis management module includes a printed circuit board having at least one processor and a memory for storing executable instructions. The executable instructions may control the operation of the payload blades, along with other functions of the shelf such as power management, power monitoring and temperature monitoring.

Typically, in a standard ATCA shelf including those in a 5U size, two of the available slots are allocated for hub slots. The remainder of the slots are payloads, which are communicatively coupled with each of two chassis management modules via at least one of two hub blades (e.g., switches). As such, these two hub blades occupy valuable slots that would otherwise be available for use as payload slots and therefore reduce the computing potential of the shelf.

Advantageously, the functions of the Shelf Manager (ShMC) and the Hub device may be integrated into a single FRU. This may have the benefit of increasing the number of slots available in the chassis for other functions. Additionally, integration of these components may reduce the cost of goods sold (COGS) value for ATCA shelves that incorporate such integrated devices. Moreover, integrated chassis management modules (hereinafter "ICMMs") may consume less power (in some cases having an operating power of less than 100 Watts) relative to non-integrated devices. Integration of these components may also reduce the operating cost (e.g., power consumption) of systems that utilize multiple ATCA shelves, as consolidating payload blades into relatively fewer shelves may reduce the total number of ATCA shelves for the system.

SUMMARY

According to some embodiments, the present technology may be directed to a printed circuit board (PCB) for an Advanced Telecommunications Computing Architecture (ATCA) shelf. The ATCA shelf may comprise a backplane providing a redundant power supplies and connections for two Shelf Management Controllers (ShMC). The PCB may include a shelf management controller (ShMC) and a multiport switch. The multiport switch electrically couples the first ShMC with the alternate ShMC by way of the backplane.

The ShMC and the multiport switch operate on standby power, allowing them to perform all their functions even when payload power is not applied in the overall system.

In additional embodiments, the present technology may be directed to an Advanced Telecommunications Computing Architecture (ATCA) shelf that includes: (a) a shelf housing having six slots, each of the slots being available to receive a payload blade; (b) a backplane electrically coupling each of the six slots with both a first integrated chassis management module (ICMM) and a second ICMM; (c) the first ICMM comprising: (i) a printed circuit board having a shelf management controller and a multiport switch; (ii) a first Ethernet port that electrically couples a shelf management controller of the first ICMM to a shelf management controller of the second ICMM by way of a multiport switch of the second ICMM, via the backplane; and (iii) a second Ethernet port that electrically couples the shelf management controller of the first ICMM to the shelf management controller of the second ICMM by way of a multiport switch of the first ICMM, via the backplane; and (d) the first shelf management controller and the second shelf management controller each being configured to manage and control each payload blade disposed within the six slots.

In some exemplary embodiments, the present technology may be directed to methods for increasing available payload slots of an Advanced Telecommunications Computing Architecture (ATCA) shelf while reducing the power consumption of the shelf. The methods may include: (a) accessing a standard ATCA shelf that includes: (i) a housing having six slots, each of the slots being configured to receive a payload, two of the slots receiving a hub such that only four slots are available to each receive a payload; and (ii) two chassis management modules being electrically coupled with each of the slots via at least one of the two hubs, by way of a backplane; (b) modifying the standard ATCA shelf by: (1) removing the two chassis management modules; (2) removing the two hubs such that each of the six slots are available to receive a payload; (3) replacing the two chassis management modules and the two hubs with a first ICMM and a second ICMM, the first ICMM comprising a shelf management controller electrically coupled with a shelf management controller of the second ICMM via at least one of a multiport switch associated the first ICMM and a multiport switch associated with the second ICMM, the multiport switch utilizing standby power at least when payload power is not available; and (c) the modified ATCA shelf having lower power consumption relative to the standard ATCA shelf.

In additional embodiments, the present technology may include an ATCA shelf that comprises: (a) a shelf housing having six slots, each of the slots being available to receive a payload blade; (b) two identical ICMMs, each of the two identical ICMMs comprising: (i) a printed circuit board comprising: (1) a shelf management controller; (2) a hub electrically coupling the shelf management controller with each of the six slots; and (3) a multiport switch; (ii) a first Ethernet port that electrically couples a shelf management controller of the ICMM to a shelf management controller of the other ICMM by way of a multiport switch of the other ICMM; (iii) a second Ethernet port that electrically couples the shelf management controller of the ICMM to the shelf management controller of the other ICMM by way of a multiport switch of the ICMM; and (iv) wherein one of the two identical ICMMs is an active ICMM and the other is a standby ICMM; (b) a backplane that electrically couples each of the six slots with each of the active ICMM and the standby ICMM; and (c) wherein the standby ICMM monitors the active ICMM, via at least one of the first and second Ethernet ports, for the occurrence of a failure event and replaces the active ICMM upon detection of a failure event.

DETAILED DESCRIPTION

Figure 1:
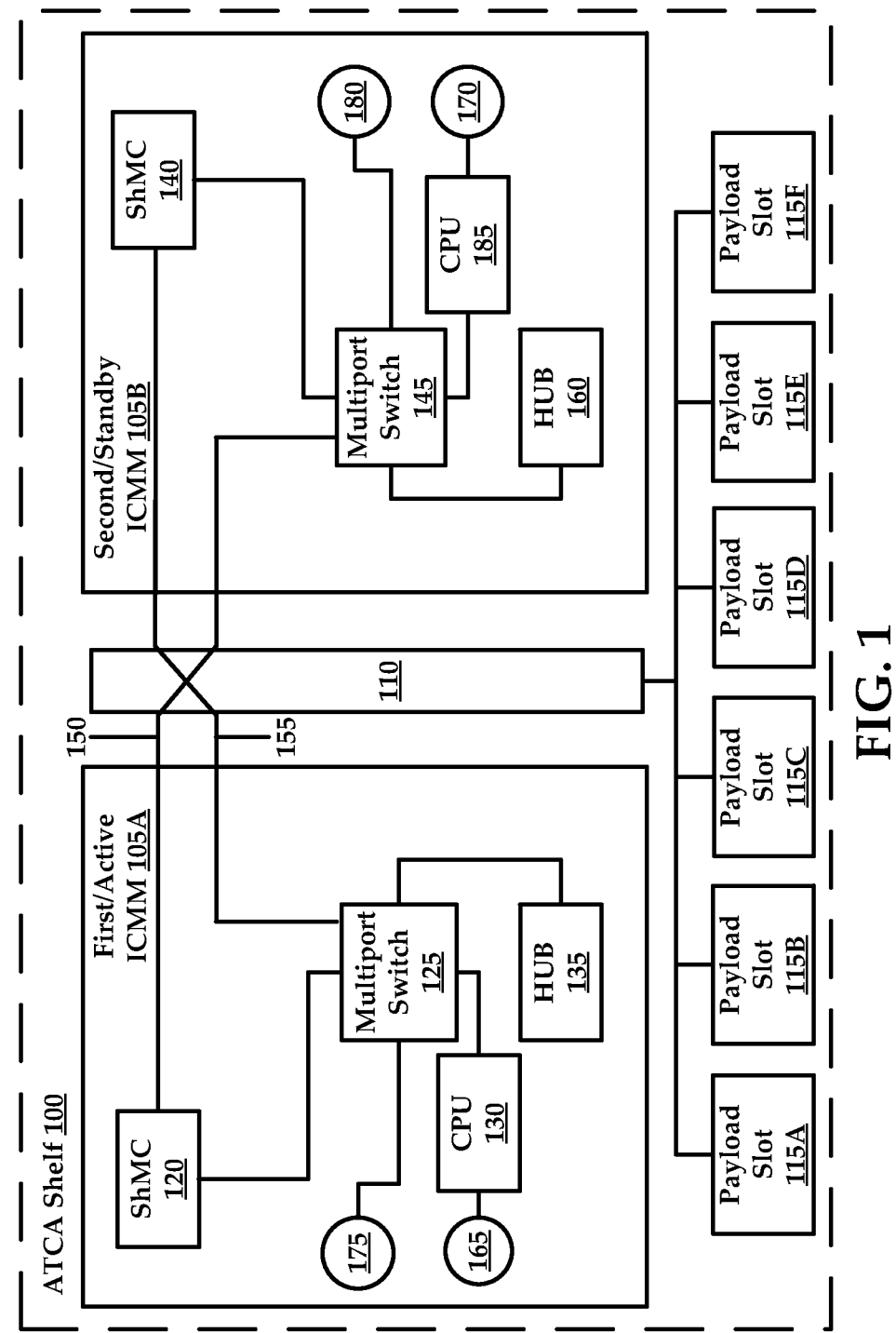
FIG. 1 is a block diagram of a portion of an exemplary ATCA shelf, constructed in accordance with the present technology.

While this technology is susceptible of embodiment in many different forms, there is shown in the figures and will herein be described in detail several specific embodiments with the understanding that the present disclosure is to be considered as an exemplification of the principles of the technology and is not intended to limit the technology to the embodiments illustrated.

Generally speaking, the present technology is directed to energy efficient ATCA shelves and also to methods for reducing the power consumption of standard ATCA systems that include a plurality of ATCA shelves.

Broadly speaking, the energy efficiency of a standard 5U ATCA shelf may be improved by utilizing a pair of redundant integrated chassis management modules. Each of the ICMMs may include the combination of a shelf management controller (ShMC) and a multiport switch on a single printed circuit board. Additionally, the ICMMs may each include a hub that couples the ShMC to a plurality of payload blades. The integration of the ShMC and hub together results in a printed circuit board that consumes less power relative to devices that utilize independent or physically separate shelf management controllers and hub FRUs.

Additionally, because the present technology eliminates the need for dedicated hub blades, each of the six slots may receive a payload blade, rather than only four or some other number (as with common ATCA shelves).

Because ATCA shelves of the present technology may include two additional payload blades, the payload blades may be consolidated into fewer ATCA shelves, reducing the amount of ATCA shelves needed. For example, because standard ATCA shelves only have four available slots, the payload blades of three conventional ATCA shelves may be consolidated into two just (in one embodiment) ATCA shelves of the present technology. Similarly, an application that requires six ATCA payload blades can be reduced to one chassis instead of using two. Such consolidation reduces capital expenditures and decreases consumption of raw materials.

Additionally, in some embodiments, the present technology may include methods for increasing the payload capacity of a standard ACTA shelf and reducing the power consumption of the same by modifying the standard ATCA shelf. Modifications to the standard ATCA shelf may include removing the standard shelf managers and hub blades of the shelf and replacing them with a pair of ICMMs, constructed in accordance with the present disclosure.

In accordance with embodiments of the present disclosure, ICMMs may be cross-coupled by way of dedicated multiport switches included in each of the ICMMs. Data directed from a first ICMM to a second ICMM may be directed through the multiport switch of the second ICMM. Likewise, data directed from the second ICMM to the first ICMM may be directed through the multiport switch of the first ICMM. Cross-coupling of ICMMs may allow ICMMs to monitor one another for failure events. Additionally, upon the occurrence of the failure of either of the ICMMs, the cross-coupling of ICMMs may allow for access to the ShMC of the failed ICMM via the multiport switch of the second ICMM.

More specifically, the ICMMs of the present technology may utilize dedicated multiport switches that are continuously powered. These multiport switches cross-connect the ShMCs of the ICMMs together via the backplane of the shelf. Additionally, the hubs that are integrated into the ICMMs are each coupled with an external Ethernet port that is always or substantially always available in some embodiments. As such, both ShMCs of the ICMMs are also continually available or "online" by way of the either of the external Ethernet ports. That is, the ShMC of a first ICMM may be accessed via the external Ethernet port associated with the hub of the second ICMM. Likewise, the ShMC of the second ICMM is available through an opposing external Ethernet port.

It is noteworthy to mention that the terms "integrated chassis management modules" or "ICMMs" may include printed circuit boards that include a shelf management controller along with a multiport switch and optionally, a hub.

Referring now to FIG. 1, a schematic diagram of a portion of an exemplary ATCA shelf 100 is shown. The shelf 100 is shown as generally including a pair of exemplary integrated chassis management modules (ICMMs), such as a first ICMM 105A and a second ICMM 105B. Both the first and second ICMMS are shown electrically coupled via a backplane 110. In some embodiments, the pair of ICMMs may be referred to as a "shelf management system." The first and second ICMMs 105A and 105B may be configured to operate in a redundant manner such that there is an active ICMM and a standby ICMM. It will be understood that the standby ICMM monitors the active ICMM for the occurrence of a failure event. Upon the occurrence of a failure event, the standby ICMM may take over the control and monitoring functions of a failed ICMM, as will be discussed in greater detail infra.

The backplane 110 functions as an electrical interface between individual payload slots 115A-F and the first and second ICMMs 105A and 105B. In some embodiments, the backplane 110 may provide at least one of payload power and/or standby power to any of the components of the shelf 100, which are electrically coupled to the backplane 110.

Although not shown, the shelf 100 may include a shelf housing having a plurality of rails, brackets, and other mechanical interfaces for receiving the components of the shelf 100, such as the backplane 110, payload blades, ICMMs 105A and 105B, and so forth.

Additionally, while the shelf 100 may include many additional components such as blades, fan trays, a chassis data manager, rear transition modules, and an intelligent platform management controllers—just to name a few, one of ordinary skill in the art would be well versed in the interrelation and operation of these common components. Therefore, in the interest of brevity, a detailed discussion of these components will be omitted.

Each of the first and second ICMMs 105A and 105B may be electrically coupled with each of six payload slots 115A-F via the backplane 110. It will be understood that each of the six payload slots 115A-F may be configured to electrically and mechanically couple with a payload blade.

As used herein, the terms "module," "controller," and/or "manager" may also refer to any of an application-specific integrated circuit ("ASIC"), an electronic circuit, a processor (shared, dedicated, or group) that executes one or more software or firmware programs, a combinational logic circuit, and/or other suitable components that provide the described functionality.

In some embodiments, an ICMM (both first and second) may be understood to include both the hardware (e.g., printed circuit board, memory, processor, and so forth) and software (executable instructions stored in memory) that controls and/or monitors the operation of the payload slots 115A-F that are installed in the shelf 100.

In some embodiments, the first and second ICMMs 105A and 105B may be constructed identically to one another. In other embodiments, the first and second ICMMs 105A and 105B may have at least one difference therebetween. A difference may include at least one difference in the hardware and/or software of the ICMM. For example, the first ICMM 105A may include additional Ethernet ports relative to the second ICMM 105B. It is noteworthy to mention that in FIG. 1, the first and second ICMMs 105A and 105B include substantially identical devices.

For purposes brevity, only the construction of first ICMM 105A will be described in greater detail. The first ICMM 105A may include a single printed circuit board that includes a shelf management controller (ShMC) 120, a multiport switch 125, a processor 130, and a hub 135.

The first ICMM 105A may include a ShMC 120 that is electrically coupled with a multiport switch 125. It will be understood that the ShMC 120 may also be referred to as a "shelf manager" or "shelf management module." The ShMC 120 may include executable instructions that may be executed by the processor 130 to control and/or monitor the operation of one or more of the payload slots 115A-F. The ShMC 120 may also include instructions that, when executed, monitor the second ICMM 105B for a failure event when the first ICMM 105A is in a standby configuration.

Because the first ICMM 105A provides monitoring data indicative of the operational status of the payload slots 115A-F, it is advantageous for the first ICMM 105A to communicatively couple with remote client devices (not shown) via external Ethernet ports, as will be discussed in greater detail herein. The remote client devices allow system administrators to monitor the operational status of the shelf 100 (or individual payload blades) from a remote location. To be sure, operational status may include, but is not limited to, workload, temperature, power consumption, and so forth.

In some embodiments, the shelf 100 and client devices are communicatively coupled via a local area network (LAN), although other private or public communications channels such as the Internet may also utilized in accordance with the present technology.

In some embodiments, the multiport switch 125 includes a five-port switch, although other switches having fewer or greater numbers of ports are likewise contemplated for use in accordance with the present technology. Therefore, the first ICMM 105A may include a multiport switch having an n-number of ports, depending upon the number of additional components included on the first ICMM 105A.

It will be understood that the first and second ICMMs 105A and 105B may be communicatively cross-coupled with one another. Signals or communications (e.g., status signals that may indicate failure of the first ICMM) from the ShMC 120 of the first ICMM 105A, directed to the second ICMM 105B, may route through the multiport switch 145 of the second ICMM 105B. Similarly, signals or communications from the ShMC 140 of the second ICMM 105B, directed to the first ICMM 105A, may route through the multiport switch 125 of the first ICMM 105A.

The ShMC 120 of the first ICMM 105A may cross-couple with the second ICMM 105B by way of a first Ethernet port 150 and a second Ethernet port 155. The first Ethernet port 150 may route through the multiport switch 145 of the second ICMM 105B. Correspondingly, the second Ethernet port 155 may route through the multiport switch 125 of the first ICMM 105A.

The ShMC 120 of the first ICMM 105A may communicatively couple with the second ICMM 105B via the multiport switch 145 of the second ICMM 105B. That is, the ShMC 120 may communicatively couple with a WAN (not shown) or other network or device via the ShMC 140 of the second ICMM 105B, and vice versa.

For example, the first and second ICMMs 105A and 105B of the present technology may utilize dedicated multiport switches that are continuously powered. These multiport switches cross-connect the ShMCs (120 and 140) of the ICMMs together via the backplane 110 of the shelf 100. Additionally, the hubs (135 and 160) that are integrated into the ICMMs are each coupled to an external Ethernet port that is always available. For example, external Ethernet port 165 is associated with CPU 130 and external Ethernet port 170 is associated with CPU 185. Another external Ethernet port 175 may be associated with the multiport switch 125 as well as another external Ethernet port 180 with the multiport switch 145.

As such, both ShMCs of the ICMMs are also continually available or "online" and accessible via any of the external Ethernet ports. That is, the ShMC of a first ICMM may be accessed via the external Ethernet port 180 associated with the multiport switch 145 of the second ICMM. The ShMC of the second ICMM is likewise available through an opposing external Ethernet port 175.

Therefore, even if the CPU 130 or the hub 135 fails, the ShMC 120 of the first ICMM 105A is still accessible via the external Ethernet port 175 associated with the multiport switch 125 or the external Ethernet port 180 of the second ICMM 105B.

Figure 2:
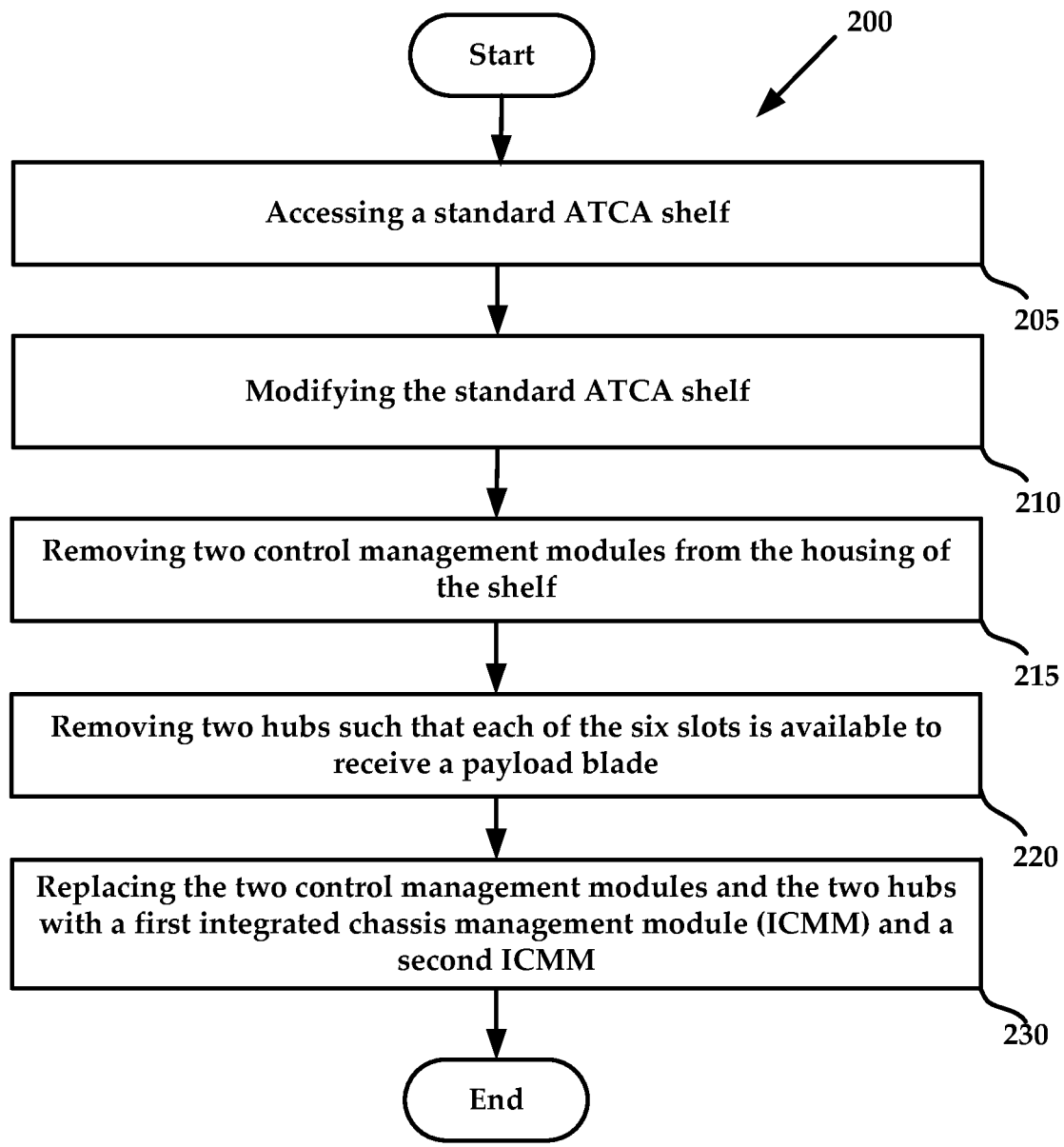
FIG. 2 is an exemplary flowchart of an exemplary method for increasing available payload slots of a standard ATCA shelf while reducing the power consumption of the same.

FIG. 2 is a flowchart 200 of an exemplary method for increasing available payload slots of a standard Advanced Telecommunications Computing Architecture (ATCA) shelf while reducing the power consumption of the shelf.

The method may include the step 205 of accessing a standard ATCA shelf. It will be understood that accessing may include obtaining physical access to the shelf and opening the housing of the shelf to expose the components therein. It will also be understood that the housing of the shelf may include having six slots that are configured to receive payload blades.

In standard ACTA shelves, two of the slots each receive a hub such that only four slots are available to each receive a payload blade.

Modifying the standard ATCA shelf in step 210 may increase the payload capacity of the shelf. The step 210 of modifying may include a step 215 of removing the two chassis management modules from the housing of the shelf, along with other control devices such as a shelf alarm panel.

Next, the method may include the step 220 of removing the two hubs such that each of the six slots is available to receive a payload blade. The method may then include a step 230 of replacing the two chassis management modules and the two hubs with a first integrated chassis management module (ICMM) and a second ICMM.

It is noteworthy to mention that the first ICMM may include a shelf management controller that is electrically coupled with a shelf management controller of the second ICMM via at least one of a multiport switch associated the first ICMM and a multiport switch associated with the second ICMM. Additionally, the multiport switch may utilize standby power at least when payload power is not available.

The modification of the standard ATCA shelf, according to the present technology, lowers power consumption of the shelf relative to the standard ATCA shelf. This reduction in power consumption relates (at least partially) to the integration of the shelf management controller and hub together into a single printed circuit board.

Additional benefits include redundant communication and control functionalities between the first and second ICMMs. It will be understood that in some embodiments, the method may include additional or fewer steps. Moreover, the steps of the method may be executed in any suitable order.

Other exemplary methods may include replacing a set of three standard ATCA shelves with two modified ATCA shelves, the two modified ATCA shelves having less energy consumption, while operating and monitoring the same amount of payload blades relative to the three standard ATCA shelves. When replacing standard ATCA shelves with modified ATCA shelves in ATCA shelf systems having large numbers of 5U ATCA shelves, significant savings may be realized based upon the a reduction in the number of required shelves. These savings are in addition to savings related to lower operational costs caused by a reduction in power consumption.

While the above descriptions and exemplary embodiments contemplate 5U ATCA shelves, the ICMMs or the present technology may impart benefits to other ATCA shelves such as 14U ATCA shelves, along with other suitable systems or devices that currently utilize physically separated (i.e., separate printed circuit boards) shelf management controllers and hubs.

Figure 3:
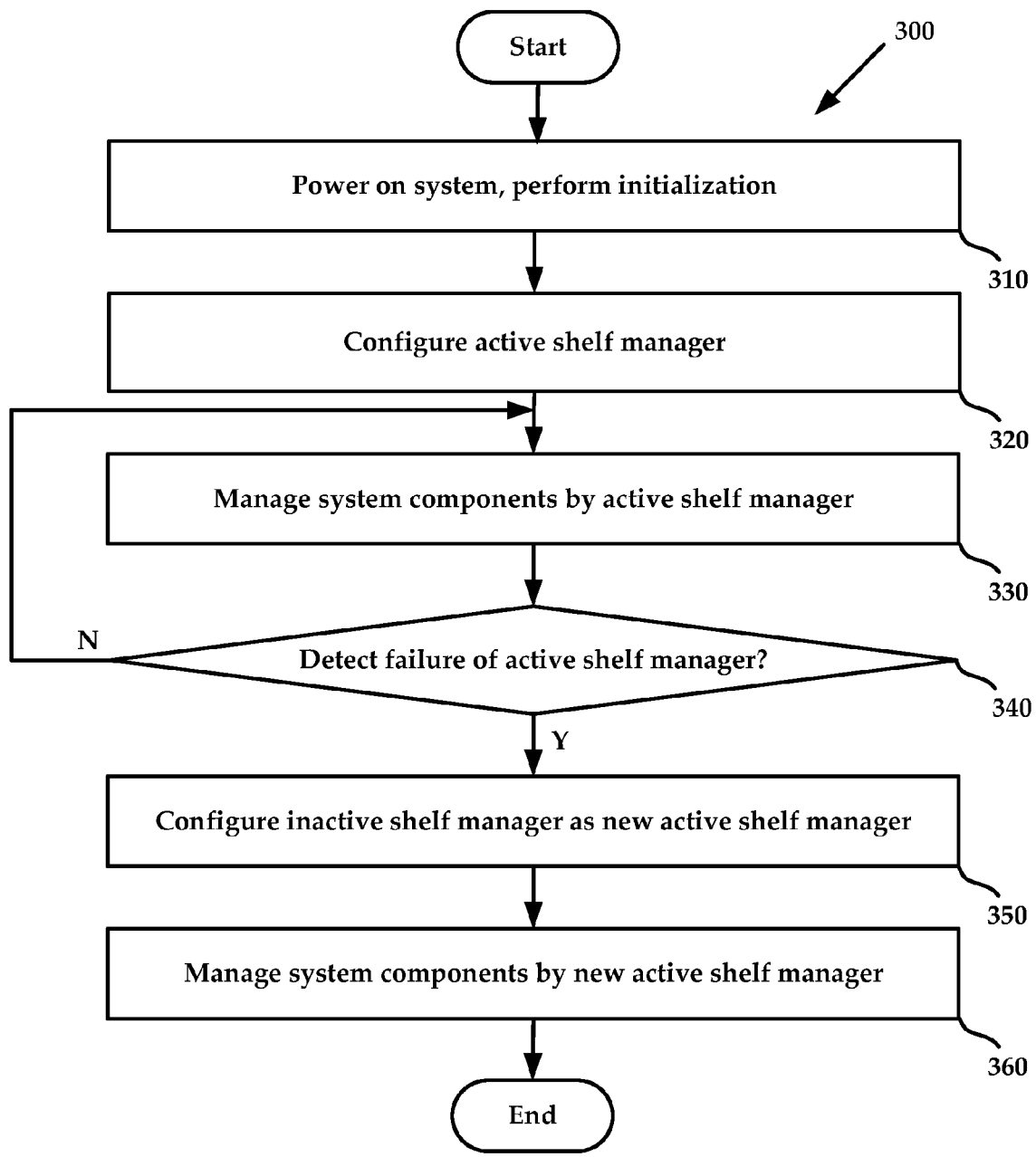
FIG. 3 is an exemplary flowchart of a method for managing an ATCA shelf that includes a pair of integrated chassis management modules.

FIG. 3 is an exemplary flow chart 300 of a method for managing an ATCA system. The method of FIG. 3 may be performed by a system of the present technology, such as that illustrated in FIG. 3. First, power is applied to the system and initialization may be performed at step 310. The active ICMM may be configured at step 320. During normal operation, the first ICMM 105A is in an active state and the second ICMM 105B is in a standby state. Therefore, for the purposes of illustration, the first ICMM 105A may be referred to as the active ICMM, and the second ICMM 105B may be referred to as the standby ICMM. These ICMMs communicate via Ethernet with a WAN, and are redundant, so that if one fails, the other is capable of performing its function.

System components such as the payload blades are managed by the active ICMM at step 330. The active ICMM communicates with payload slots 115A-F via the backplane 110 through a hub. During operation, the standby ICMM may monitor of the actions of active ICMM for the occurrence of a failure event. Upon the occurrence of a failure event, the standby ICMM would be ready to take over the functionalities of the active ICMM.

A determination is made as to whether the active ICMM has failed or malfunctioned at step 340. In the event of a failure of the active ICMM, the active ICMM may cease communicating with one or more components of the active ICMM, the standby ICMM, or other components of the ATCA shelf. If no failure is detected at step 340, the active ICMM continues to manage system components at step 330.

If failure of the active ICMM is detected, the standby ICMM is configured as the new active ICMM at step 350. The new active ICMM then manages system components at step 360. In this mode, the second ICMM 105B communicates with payload slots 115A-F via hub 160 or alternatively hub 135 of the first ICMM 105A. If the failure of the first ICMM 105A is temporary, it may be switched into a waiting state and the process reversed at a later time. (For example, ICMMs 105A and 105B may cooperate together in a master/slave relationship.)

Additionally, the use of inexpensive multiport switches allows ICMMs 105A and 105B to be redundantly coupled to each other without requiring payload power to be delivered to each ICMM simultaneously. Standard ATCA shelves rely on additional ports coupled with the backplane itself to couple standard shelf managers together. More particularly, presently known configurations depend upon Ethernet switches that run on payload power. Thus, the shelf managers can lose connectivity to the WAN when payload power is not present because there are no available powered-up ports with which to pass their data packets. By using cross-connected multiport switches that run by standby power, embodiments according to the present disclosure allow the shelf management controllers (ShMCs) of an active ICMM to communicate directly with the WAN, or indirectly via the multiport switch of the standby ICMM.

Furthermore, in some embodiments, because there is always a path from both ICMMs to the WAN, each ShMC of the ICMMs may be upgraded, one after another, from an external source via the WAN. This may be accomplished by placing one ICMM in standby mode and the other in active mode, upgrading the standby ICMM, and then switching active/standby modes of the ICMMs and upgrading the other ICMM. This process of upgrading one or more of the ICMMs while retaining ICMM functionality in the ATCA shelf may be referred to as "hot swaping." That is, because the ICMMs provide redundant functionalities, removing and replacing a failed ICMM does not interrupt the operation of the ATCA shelf.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An Advanced Telecommunications Computing Architecture (ATCA) shelf, comprising:
    a shelf housing having a plurality of slots, each of the slots being available to receive a payload blade;
    a backplane electrically coupling each of the slots with both a first integrated chassis management module (ICMM) and a second ICMM;
    the first ICMM comprising:
        a printed circuit board having a shelf management controller and a multiport switch;

a hub that electrically couples the shelf management controller to each of the slots, the hub being integrated onto the same printed circuit board as the shelf management controller of the first ICMM;

a first Ethernet port that electrically couples the shelf management controller of the first ICMM to a shelf management controller of the second ICMM by way of a multiport switch of the second ICMM, via the backplane; and a second Ethernet port that electrically couples the shelf management controller of the first ICMM to the shelf management controller of the second ICMM by way of the multiport switch of the first ICMM, via the backplane;

the second ICMM comprising a hub that electrically couples the shelf management controller of the second ICMM to each of the slots, the hub being integrated onto the same printed circuit board as the shelf management controller of the second ICMM; and the first shelf management controller and the second shelf management controller each being configured to manage and control each payload blade disposed within the slots, including selectively controlling power that is provided to the hubs of the first and second ICMMs.

2. The Advanced Telecommunications Computing Architecture (ATCA) shelf according to claim 1, wherein the first shelf management controller is communicatively coupled with a wide area network (WAN) through the second shelf management controller via the backplane, and vice versa.

3. The Advanced Telecommunications Computing Architecture (ATCA) shelf according to claim 1, wherein the multiport switch includes any of a three-port switch, a five-port switch, and an n-port switch.

4. The Advanced Telecommunications Computing Architecture (ATCA) shelf according to claim 1, wherein the shelf management controller of the second ICMM is accessed via an external Ethernet port associated with the multiport switch of the first ICMM and the shelf management controller of the first ICMM is accessed via the external Ethernet port associated with the multiport switch of the second ICMM.

5. The Advanced Telecommunications Computing Architecture (ATCA) shelf according to claim 1, wherein the multiport switch is a five-port unmanaged switch.

6. The Advanced Telecommunications Computing Architecture (ATCA) shelf according to claim 1, wherein the first ICMM and the second ICMM are configured in an active-standby relationship.

\* \* \* \* \*